(12) United States Patent
Shayani et al.

(10) Patent No.: US 12,316,314 B1
(45) Date of Patent: May 27, 2025

(54) HALL EFFECT KEYBOARD

(71) Applicant: FINALMOUSE LLC, Irvine, CA (US)

(72) Inventors: Ashkon Shayani, Dana Point, CA (US);
Daniel James Blase, Everett, WA (US);
Maxime Dirk R Vincent, Hasselt (BE);
Nathan Stanislaw Zuber, Lake Forest Fark, WA (US)

(73) Assignee: Finalmouse LLC, Irvine, CA (US)

( * ) Notice: Subject to any disclaimer, the term of this patent is extended or adjusted under 35 U.S.C. 154(b) by 0 days.

(21) Appl. No.: 18/778,690

(22) Filed: Jul. 19, 2024

(51) Int. Cl.
*H03K 17/972* (2006.01)
*H01H 36/00* (2006.01)

(52) U.S. Cl.
CPC ......... *H03K 17/972* (2013.01); *H01H 36/004* (2013.01)

(58) Field of Classification Search
CPC .............. H03K 17/972; H01H 36/004
See application file for complete search history.

(56) References Cited

U.S. PATENT DOCUMENTS

| | | | | |
|---|---|---|---|---|
| 3,815,066 A | * | 6/1974 | Vinal | H03K 17/90 335/207 |
| 9,123,485 B2 | | 9/2015 | Niu et al. | |
| 9,870,880 B2 | * | 1/2018 | Zercoe | H01H 13/06 |
| 9,962,608 B2 | * | 5/2018 | Soelberg | A63F 13/42 |
| 2010/0319799 A1 | * | 12/2010 | McCarty | F16K 47/08 366/337 |
| 2021/0225602 A1 | * | 7/2021 | Chen | H01H 13/84 |
| 2021/0247850 A1 | * | 8/2021 | Norwalk | G06F 3/038 |
| 2021/0263916 A1 | * | 8/2021 | Niu | H04L 67/01 |
| 2024/0319799 A1 | * | 9/2024 | Subramaniam | G06F 3/016 |

\* cited by examiner

*Primary Examiner* — Amine Benlagsir
(74) *Attorney, Agent, or Firm* — Fish & Richardson P.C.

(57) ABSTRACT

A keyboard includes a plurality of keys. Each key includes a keycap, a coil spring extending from a top side of the keycap to a bottom side of the transparent top case, and a magnet positioned within the keycap. The coil spring biases the keycap toward an undepressed position.

20 Claims, 6 Drawing Sheets

HALL EFFECT KEYBOARD

TECHNICAL FIELD

This specification relates to keyboards.

BACKGROUND

A keyboard includes keys that can be actuated by a user to operate a computing device, e.g., a laptop computer, a desktop computer, or other user computing device. The keyboard can provide signals that are used to operate the computing device, e.g., for typing or executing other operations of the computing device.

SUMMARY

This disclosure describes a keyboard for use with a user computing device. The keyboard includes a top case and a plurality of keys. Each key includes a coil spring and a magnet positioned within the key, e.g., within an internal space defined within the coil spring. In some implementations, the keyboard further includes a display underlying the top case. The display includes a visual side that presents content to a user through the top case of the keyboard.

Advantages of implementations of the systems and methods described in this disclosure may include those described below and elsewhere in this disclosure.

A keyboard in accordance with implementations described in this disclosure has a long operational life and is easy to assemble and thus has low manufacturing costs. A snap fit locking mechanism between the keycaps and the top case enables labor-efficient installation of the keycaps to the top case, and thus reduces the time and labor costs required to manufacture the keyboard, because neither extra tools nor separate mechanical fasteners are necessary to form the locking mechanism. Moreover, by forming some other components of the keyboard as a "stack up," where a group of components are positioned in layers, e.g., adjacent to and/or coupled to one another, to form the keyboard, the manufacturing cost can be kept low.

A keyboard in accordance with implementations described in this disclosure can provide a user experience engaging tactile and visual senses of a user. In particular, the keyboard can use the spring force provided by the coil spring under the keycap to generate tactile feedback to the user as the user presses a particular key, especially compared to a digital keyboard that relies on one or more vibration units of a mobile computing device to provide tactile feedback as a user operates a digital key. A guidance that is surrounded by the coil spring enables the keycap to move vertically with less wobble. Furthermore, the display of the keyboard further allows the keyboard to provide content that is visible through the keys of the keyboard, thus allowing the keyboard another modality of stimulating the senses of the user as the user operates the keyboard.

A keyboard in accordance with implementations described in this disclosure can improve human computer interaction. For example, the display of the keyboard can provide content, e.g., imagery and/or videos, that improve the functioning of the keyboard and engagement, e.g., visual engagement, with the keyboard. Further, the components of the keyboard can allow the content provided by the display to be more easily visible from the perspective of a user using the keyboard, e.g., when the keyboard is viewed from above. The display can be visible through the components of the keyboard.

A keyboard in accordance with implementations described in this disclosure can provide information to a user by presenting content to the user through the display. The content provided by the display of the keyboard can, for example, be coordinated with information presented on a display of a computing device for which the keyboard serves as a user input device, or can present other useful information for the user (e.g., a time, a battery life, or other information). Moreover, a keyboard in accordance with some implementations described in this disclosure can enable a user to operate the keyboard in low light conditions.

The details of one or more implementations of the subject matter described in this specification are set forth in the accompanying drawings and the description below. Other potential features, aspects, and advantages will become apparent from the description, the drawings, and the claims.

DETAILED DESCRIPTION

Figure 1:
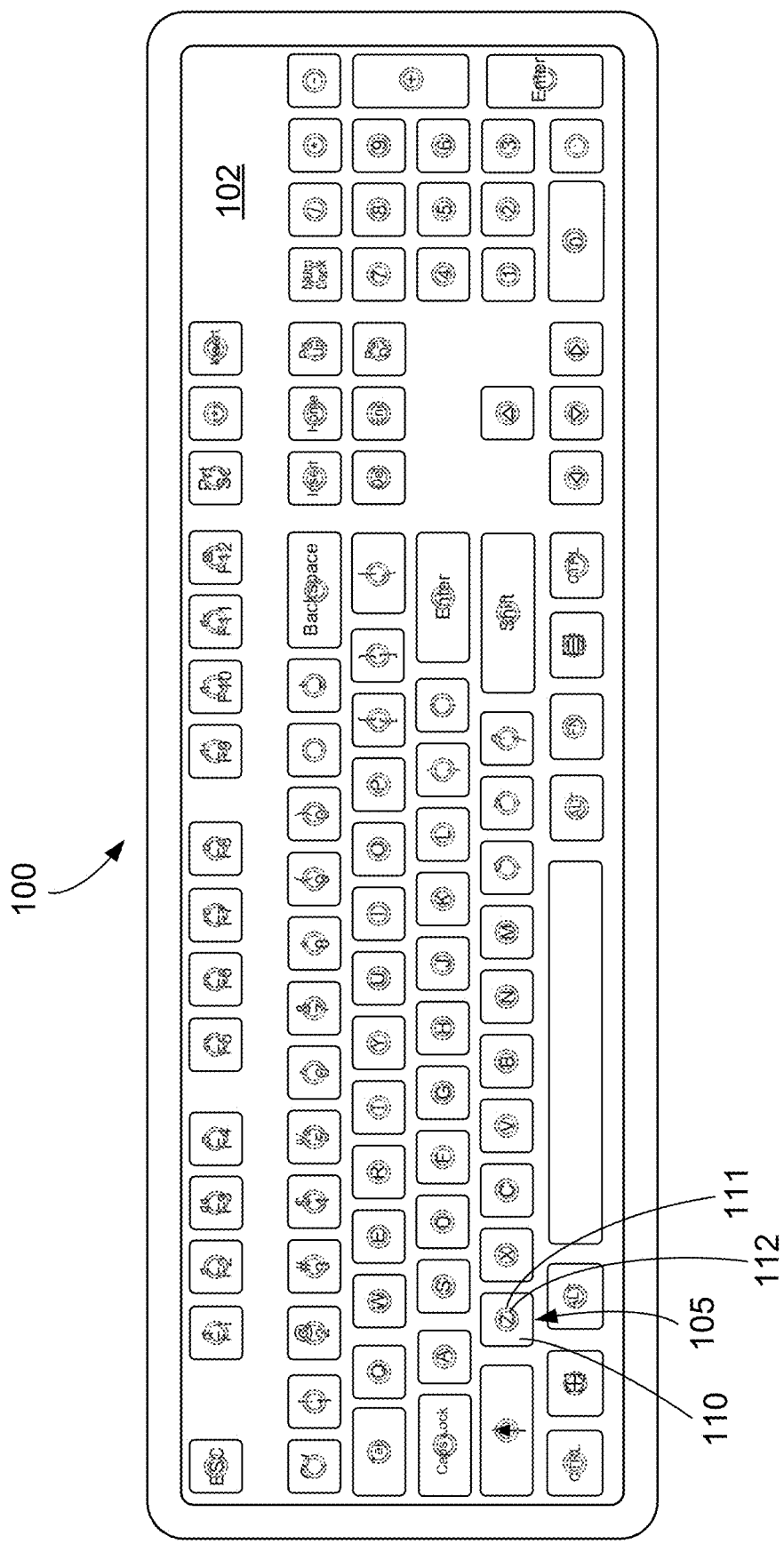
FIG. 1 is a top view of an example of a keyboard.

FIG. 1 is a top view of an example of a keyboard 100. The keyboard 100 includes a plurality of keys, e.g., the key 105. The keyboard 100 can be operably connected to a user computing device, e.g., via a wired connection or a wireless connection, thereby allowing the keyboard 100 to generate signals for controlling the user computing device. The keyboard 100 can generate the signals in response to keystrokes or other operations of the plurality of keys, thus allowing a user to type text or otherwise operate the keys in defined ways to control the user computing device. Examples of a user computing device include a laptop computer, a desktop computer, a tablet computing device, a smartphone, a gaming device, a digital music player, a wearable computing device, a health monitoring device, to name just a few.

Each key includes a keycap, e.g., the key 105 includes a keycap 110. The keycap 110 is a user-operable portion of the key 105 that a user presses with a finger in order to actuate the key 105. For example, the keycap 110 of the key 105 can include a top side having an upward facing surface that the finger of the user engages with and pushes or depresses to actuate the key 105.

In implementations, the keycaps can vary in shape and size. For example, the keycaps can be substantially square (as illustrated in FIG. 1), substantially rectangular, or substantially circular shaped. Moreover, the keycap 110 can be formed from any suitable material. In the example of FIG. 1, the keycap 110 can be made from metal, a ceramic, a rigid plastic or another polymer, a fiber-matrix composite, and so on.

Each key also includes a coil spring, e.g., the key 105 includes a coil spring 111. The coil spring 111 is positioned inside the keycap 110. The coil spring 111 has two ends: a top end and a bottom end. In the example of FIG. 1, the coil spring 111 has a circular cross-sectional shape. However, this is not required. In other examples, the coil spring 111 can have different shapes, such as an oval cross-sectional shape, a rectangular cross-sectional shape, a square cross-sectional shape, a triangular cross-sectional shape, or another more complex cross-sectional shape.

Within the keycap 110, the top end of the coil spring 111 is positioned at or near a center point of a downward facing surface of the top side of the keycap 110. The coil spring 111 extends from the downward facing surface of the top side of the keycap 110 to a bottom side of a top case 102, where the bottom end of the coil spring 111 is positioned.

As a result, the coil spring 111 biases the keycap 110 upwardly toward an undepressed position. That is, when the user is not pushing or depressing the key 105, and hence, no axial downward force is applied to the coil spring 111 through the top side of the keycap 110, the coil spring 111, in its uncompressed state, has a length that is no less than a distance between the top side of the keycap 110 and the bottom side of the top case 102.

Each key further includes a magnet, e.g., the key 105 includes a magnet 112. The magnet 112 is positioned inside the keycap 110. In the example of FIG. 1, the magnet 112 is positioned within an internal, hollow space defined within the coil spring 111. However, this is not required. That is, the coil spring 111 can more generally be positioned within any appropriate position inside the keycap 110. In some examples, it can be positioned next to the coil spring 111, positioned at one of the four corners of the key 105, and the like.

The magnet 112 can be made of any suitable material having sufficient magnet properties. In some implementations, the magnet 112 can be a permanent magnet. For example, the magnet 112 can include, but is not limited to, ferrite, alnico, and/or rare earth materials such as samarium-cobalt and neodymium-iron-boron.

Moreover, the magnet 112 can have any appropriate shape. For example, the magnet 112 can have a cylindrical shape, a polygonal prism shape, an oval spherical shape like a rugby ball, or the like. Generally, however, the magnet 112 should be small enough in size such that the magnet 112 can fit into the space within the keycap 110. For example, in FIG. 1, the magnet 112 should be small enough in size such that the magnet 112 can fit into the internal, hollow space defined within the coil spring 111.

It will also be appreciated that some of the plurality of keys of the keyboard 100 might include more than one coil spring and, optionally, more than one magnet. For example, in some implementations, a key, e.g., a space key, of the keyboard 100 includes two coil springs inside a keycap of the space key. Within the keycap, the two coil springs can be distributed along a length of the keycap and at about equal distance from the center of the keycap. In some implementations, the space key includes two magnets, with one magnet positioned within an internal, hollow space defined within each of the two coil springs. In some other implementations, the space key includes one magnet, which is positioned within an internal, hollow space defined within one of the two coil springs.

As another example, in some implementations, a key of the keyboard 100 includes one coil spring and more than one magnet inside a keycap of the key. In some implementations, the key includes two magnets, with one magnet positioned within an internal, hollow space defined within the coil spring, and another magnet positioned outside the coil spring, e.g., the other magnet and the coil spring can be positioned side by side. In some other implementations, the key includes two magnets, with both magnets positioned outside the coil spring.

The keyboard 100 includes a top case 102 that is positioned on an upper portion of the keyboard 100. The top case 102 can take the form of an exterior, protective casing or shell that overlays the upper portion of the keyboard 100. The top case 102 can be formed as a single, integral component or can have a group of distinct components that can be configured to be coupled to one another. Additionally, the top case 102 can be formed from any suitable material. In the example of FIG. 1, top case 102 can be made from metal, a ceramic, a rigid plastic or another polymer, a fiber-matrix composite, and so on. The top case 102 and the keycap 110 can be, but need not be, made from the same material.

The plurality of keys are received by top case 102. The keycaps of the plurality of keys are mounted, e.g., removably mounted, on and positioned within the top case 102 of keyboard 100. For example, the keycap 110 is mounted on an upper surface of the top case 102 and extends upwardly from the upper surface of the top case 102 of the keyboard 100, thus allowing a user to easily access and depress the key 105.

Figure 2:
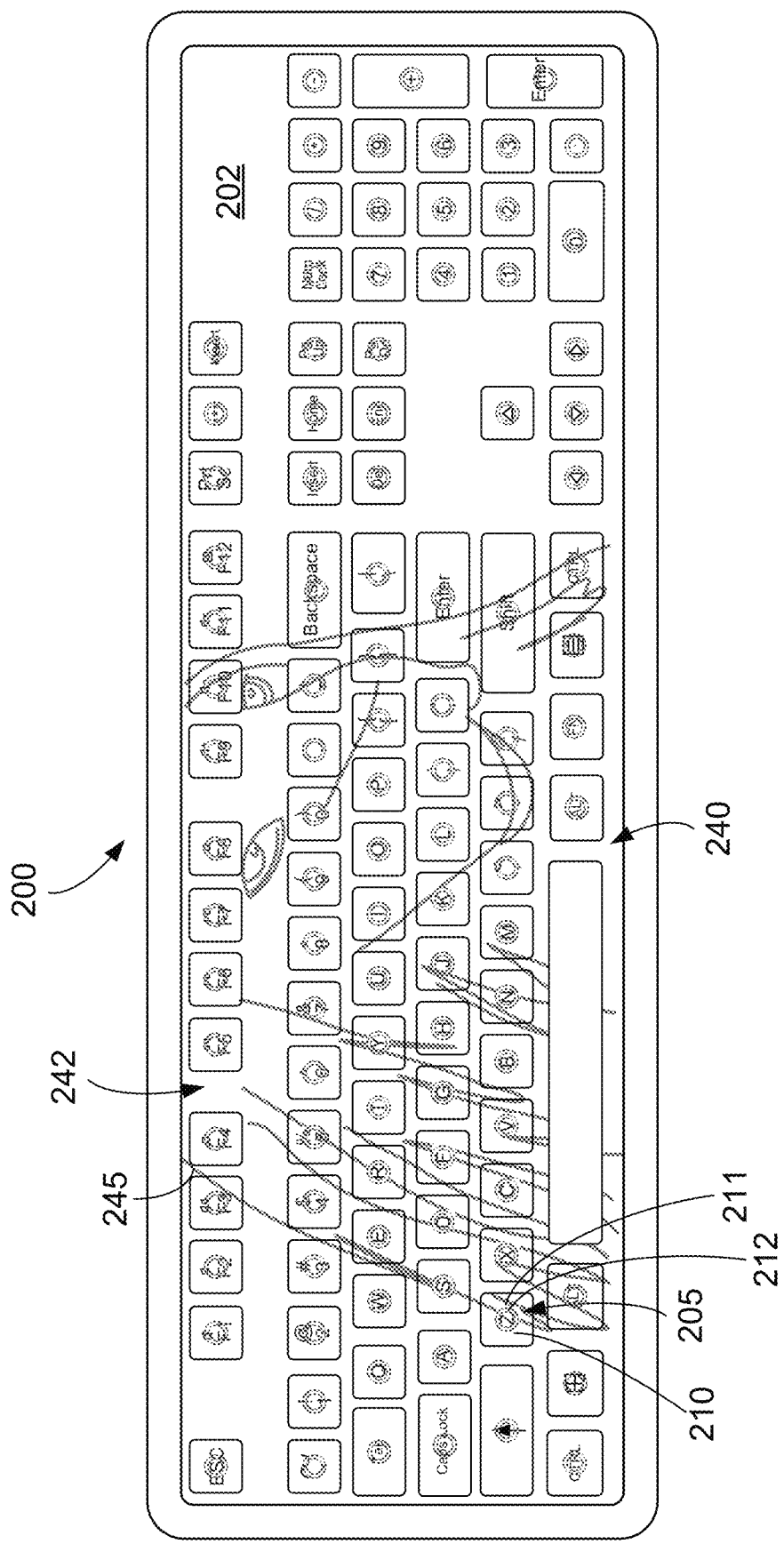
FIG. 2 is a top view of another example of a keyboard.

FIG. 2 is a top view of another example of a keyboard 200. The keyboard 200 differs from the keyboard 100 depicted in FIG. 1 in that it additionally includes a display 240 including a visual side 242 that is visible to a user during use of the keyboard 200. The display 240 can present content 245 on the visual side 242, and the visual side 242 can face the bottom side of the top case 202. For example, the top case 202 can be positioned atop the visual side 242 of the display 240, and the content 245 presented on the visual side 242 of the display 240 can be visible through the top case 202 and the plurality of keys of the keyboard 200, thereby allowing the content 245 to be visible through to the user.

To that end, at least a portion of the top case 202 is substantially transparent, e.g., have transmittance of, for example, at least 50%, at least 60%, at least 70%, at least 80%, or at least 90%. In other words, the keyboard 200 may also differ from the keyboard 100 depicted in FIG. 1 in the material that is used to form the top case 202 (when the material used to form the top case 102 of the keyboard 100 depicted in FIG. 1 is not transparent).

In some implementations, the top case 202 in its entirety is substantially transparent. In some other implementations, the central portion of the top case 202, e.g., including an area of the top case 202 that is covered by the plurality of keys of the keyboard 200, is substantially transparent but the perimeter of the top case 202 is not, e.g., it is opaque. For example, the top case 202 can be formed of a glass material (e.g., including sapphire glass, crystal glass, tempered glass, or other glass material that can be transparent) or a polymer material (e.g., polycarbonate, acrylic, polyethylene terephthalate, or other appropriate polymer material that can be transparent).

Moreover, at least a top side of each the keycaps of the plurality of keys is substantially transparent. For example, at least the top side of the keycap 210 of the key 205 (which has an upward facing surface that the finger of the user engages with and pushes or depresses to actuate the key 205) is substantially transparent.

In some implementations, the keycap 210 in its entirety is substantially transparent. That is, the top side of the keycap 210 and the vertical side walls of the keycap 210 are substantially transparent. In some other implementations, the top side of the keycap 210 is substantially transparent but the vertical side walls of the keycap 210 are not, e.g., they are opaque. For example, the keycap 210 can be formed of a glass material (e.g., including sapphire glass, crystal glass, tempered glass, or other glass material that can be transparent) or a polymer material (e.g., polycarbonate, acrylic, polyethylene terephthalate, or other appropriate polymer material that can be transparent). Again, the top case 202 and the keycap 210 can be, but need not be, made from the same material (although they both need to be substantially transparent).

Because at least a portion of the top case 202 and at least the top side of the keycap 210 are substantially transparent, the content 245 presented by the display 240 can be at least partially visible to a user during use of the keyboard 200 through the top case 202 and the plurality of keys of the keyboard 200.

Other components of the keyboard 200, such as the coil spring 211 and the magnet 212, are similar to corresponding components, such as the coil spring 111 and the magnet 112, of the keyboard 100 depicted in FIG. 1, and descriptions about those other components can apply equally to the corresponding components included in the keyboard 200.

Figure 3:
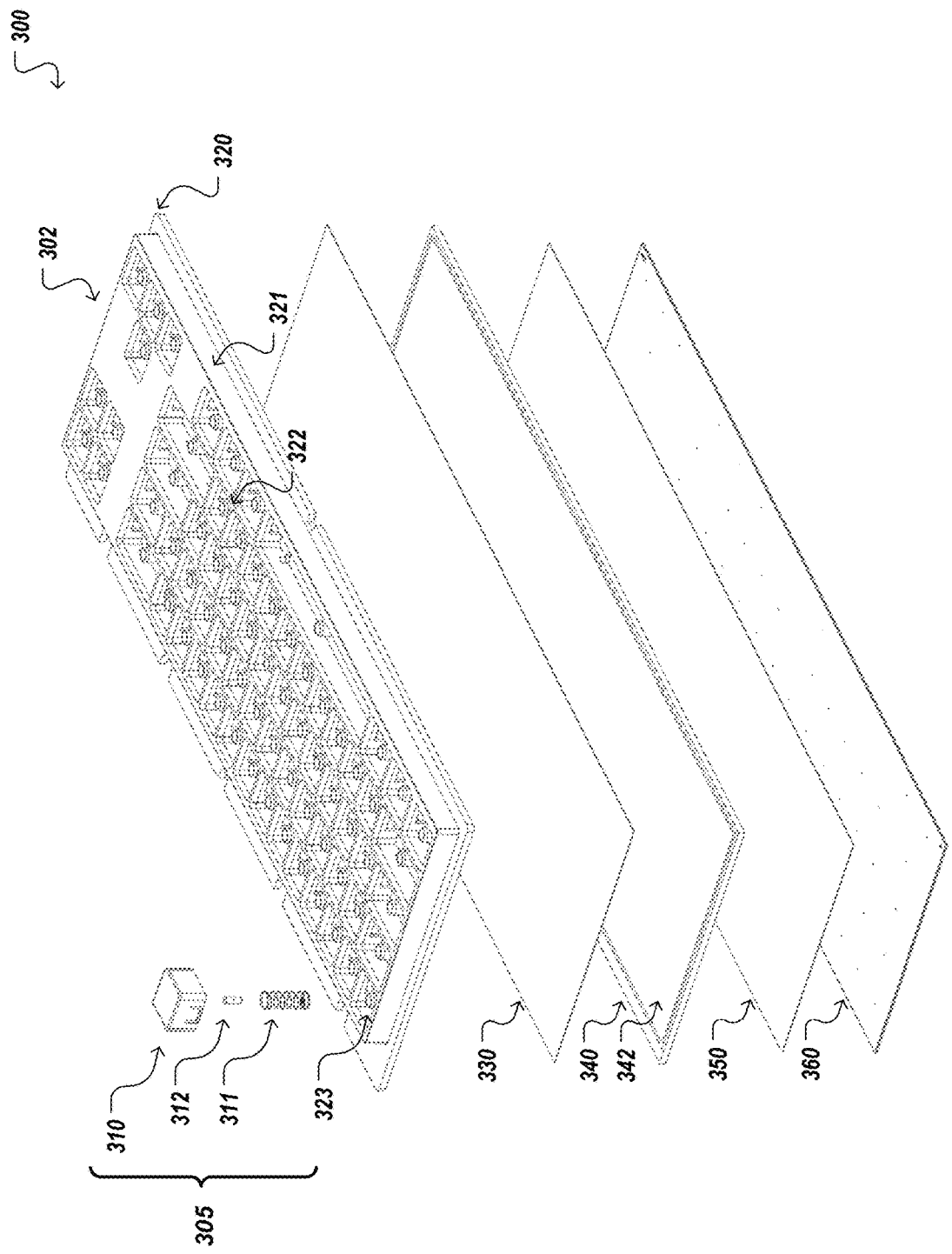
FIG. 3 is an exploded perspective view of an example of a keyboard.

FIG. 3 is an exploded perspective view of an example of a keyboard 300. As illustrated in FIG. 3, the plurality of components include a plurality of keys, including the key 305. The key 305, in turn, includes a keycap 310, a coil spring 311, and a magnet 312. At least the top side of the keycap 310 is substantially transparent.

The keyboard 300 can have overall width between 10 centimeters and 16 centimeters, and an overall length between 30 and 60 centimeters. The number of keys on the keyboard 300 can vary between 40 and 150 keys, or more or less.

The plurality of components include a top case 302. At least a portion, e.g., at least the central portion, of the top case 302 is substantially transparent. The top case 302 has two components: a base component 320, and an upper component 321 that is placed over the base component 320. The upper component 321 has intersecting ribs 322 that form a plurality of apertures which receive the plurality of keycaps, e.g., the aperture 323 which receives the keycap 310 of the key 305.

When the keyboard 300 is viewed from above, the intersecting ribs 322 of the top case 302 can substantially surround and/or can be positioned within the space between the plurality of keys. In some implementations, the base component 320 and the upper component 321 can be distinct components of the top case 302 that can be coupled to one another to form the top case 302. In other implementations, despite being described as logically separate from each other, the base component 320 and the upper component 321 can be formed as a single, integral component.

The coil spring 311 within the key 305 extends from the top side of the keycap 310 to the bottom side of the top case 302. The coil spring 311 servers a biasing means that biases or urges the keycap 310 upward toward an undepressed position. The coil spring 311 defines an internal space, which can be a cylindrical hollow space, within which the magnet 312 is positioned.

The plurality of components include a display 340 for presenting content through the top case 302 of the keyboard 300. The display 340 is positioned below the top case 302 and below the plurality of keys, including the key 305. The content, as described in this disclosure, is presented on a visual side 342 of the display 340, where the visual side 342 faces the top case 302 and the plurality of keys, such that at least some of the content is visible through the top case 302 and the keycap 310 of the keyboard 300.

The display 340 and, in particular, the visual side 342 of the display 340, can be substantially flat. In some implementations, the display 340 is a light-emitting diode (LED) display (e.g., an organic LED (OLED) display, an active-matrix OLED (AMOLED) display, or other appropriate LED display), a liquid-crystal display (LCD), or other appropriate display. The display 340 has a pixel density of, for example, at least 5, 10, 15, 20, 25, 30, 35, 40, 45, 50, 60, 70, 80, 90, 100, 125, 150, 175, 200, 250, or 300 pixels per centimeter (ppcm).

The display 340 can have a width between 50 and 400 millimeters (e.g., between 50 and 200 millimeters, between 50 and 250 millimeters, between 50 and 300 millimeters, between 75 and 225 millimeters, between 100 and 200 millimeters, at least 50 millimeters, at least 100 millimeters, about 100 millimeters, about 150 millimeters, about 200 millimeters, etc.), a length between 100 and 600 millimeters (e.g., between 100 and 400 millimeters, between 100 and 500 millimeters, between 150 and 550 millimeters, between 200 and 500 millimeters, between 250 and 450 millimeters, at least 100 millimeters, at least 200 millimeters, at least 300 millimeters, about 200 millimeters, about 250 millimeters, about 300 millimeters, about 350 millimeters, about 400 millimeters, etc.), and a thickness between 1 and 20 millimeters (e.g., between 1 and 15 millimeters, between 1 and 7 millimeters, between 1 and 5 millimeters, between 1 and 3 millimeters, about 3 millimeters, about 5 millimeters, about 7 millimeters, about 10 millimeters, about 15 millimeters, etc.).

An overall surface area of the visual side 342 of the display 340 can be between 50 and 2400 square centimeters (e.g., between 100 and 1000 square centimeters, between 250 and 750 square centimeters, at least 100 square centimeters, at least 200 square centimeters, at least 300 square centimeters, at least 400 square centimeters, about 400 square centimeters, about 500 square centimeters, about 600 square centimeters etc.).

The overall footprint area of the keyboard 300 can be between 100 and 3000 square centimeters (e.g., between 200 and 1200 square centimeters, between 400 and 1000 square centimeters, about 600 square centimeters, about 700 square centimeters, about 800 square centimeters, about 900 square centimeters). The visual side 342 of the display 340 can extend across at least 10% of the overall footprint area of the keyboard 300 (e.g., at least 20%, at least 30%, at least 40%, at least 50%, at least 60%, at least 70%, at least 80%, etc., of the overall footprint area of the keyboard 100).

The top case 302, the plurality of keys, and the display 340 can be sized such that at most 80% (e.g., at most 70%, at most 60%, at most 50%, at most 40%, at most 30%, at most 20%, etc.) of a total area of the visual side 342 of the display 240 is covered by the plurality of keys and such that at least 20% (e.g., at least 30%, at least 40%, at least 50%, at least 60%, at least 70%, or at least 80%) of a total area of the visual side 342 of the display 340 is visible through the top case 302 of the keyboard 300.

The content that can be presented using the display 340 can vary in implementations. In some implementations, the display 340 presents imagery (e.g., still images or a video) that is looped to provide an aesthetically appealing background for the keyboard 300. In some implementations, the content provides information that can be useful to a user, e.g., a battery life of the keyboard 300 or the user computing device to which the keyboard 300 is connected, a time, a ping rate, a wireless connection strength, or other information that can be useful to the user in operating the user computing device.

In some implementations, the plurality of components include a first adhesive layer 330. The first adhesive layer 330, when included, is positioned between and in contact with the bottom side of the top case 302 and the visual side 342 of the display 340. The first adhesive layer 330 is an optional component of the keyboard 300 that is used to couple, e.g., bond, the top case 302 and the display 340. For example, the first adhesive layer 330 can be an optical adhesive layer or an epoxy layer. In some implementations, the first adhesive layer 330 can have a thickness between 0.02 and 2.00 millimeters, e.g., between 0.10 and 2.00 millimeters or between 0.20 and 2.00 millimeters.

In some other implementations where the first adhesive layer 330 is not included as a component of the keyboard 300, the top case 302 and the display 340 can be coupled together through the use of one or more mechanical fasteners, such as screws, threads, nuts, and bolts, or other bonding or finishing techniques.

The plurality of components include a printed circuit board 360. The printed circuit board 360 is positioned below the display 340 and thus, below the top case 302 and below the plurality of keys, including the key 305. The printed circuit board 360 includes a top surface that faces toward the display 340 and a bottom surface that faces away from the display 340. The printed circuit board 360 is electrically coupled to a plurality of magnetic field sensors on the bottom surface. In some implementations, the printed circuit board 360 can have a thickness between 0.01 and 2.00 millimeters, e.g., between 0.10 and 2.00 millimeters or between 0.20 and 2.00 millimeters.

In implementations the printed circuit board 360 can serve as a contacting means for a plurality of magnetic field sensors, for example by providing the conductor traces on the bottom surface of the printed circuit board 360 that faces away from the display 340, i.e., that faces toward the plurality of magnetic field sensors. In implementations the printed circuit board 360 can also include other components, e.g., a microcontroller or another printed circuit, electrically coupled to the plurality of magnetic field sensors to process the magnetic field strength values generated by the magnetic field sensors to generate electrical signals.

In some implementations, the plurality of components include a second adhesive layer 350. The second adhesive layer 350, when included, is positioned between and in contact with the bottom side of the display 340 and the top surface of the printed circuit board 360. The second adhesive layer 350 is an optional component of the keyboard 300 that is used to couple, e.g., bond, the display 340 and the printed circuit board 360. For example, the second adhesive layer 350 can be a pressure-sensitive adhesive layer. In some implementations, the second adhesive layer 350 can have a thickness between 0.10 and 2.00 millimeters.

In some other implementations where the second adhesive layer 350 is not included as a component of the keyboard 300, the display 340 and the printed circuit board 360 can be coupled together through the use of one or more mechanical fasteners, such as screws, threads, nuts, and bolts, or other bonding or finishing techniques.

Figure 4:
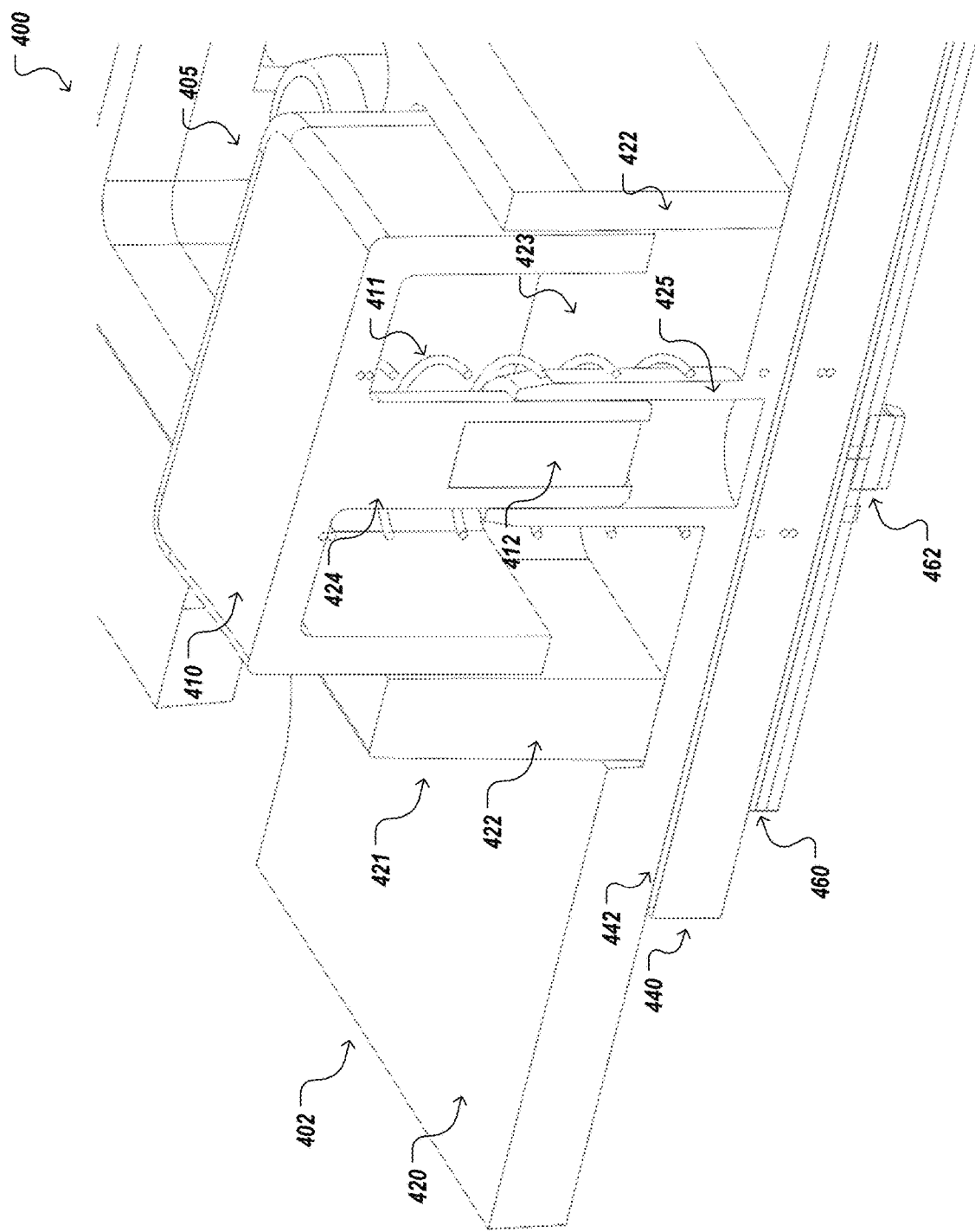
FIG. 4 is a side cross-sectional view of an example of a keyboard.

FIG. 4 is a side cross-sectional view of an example of a keyboard 400 along a vertical plane through the keyboard 400. The keyboard 400 includes a key 405 which includes a keycap 410, a coil spring 411, and a magnet 412. As mentioned briefly above, the magnet 412 should be small enough in size such that the magnet 412 can fit into the internal, hollow space defined within the coil spring 411.

For example, as illustrated in FIG. 4, when the magnet 412 has a cylindrical shape, the diameter of the circular-shaped cross section of the magnet 412 should be smaller than the diameter of the circular-shaped cross section of the coil spring 411. In some implementations, the diameter of the circular-shaped cross section of the magnet 412 is less than 5.00 millimeters. In some implementations, a longitudinal dimension of the magnet 112 is less than 10.00 millimeters to avoid excessive magnetic noise.

The keyboard 400 includes a top case 402. The top case 402 has two components: a base component 420, and an upper component 421 that is placed over the base component 420. The upper component 421 has intersecting ribs 422 that form an aperture 423 which receives the keycap 410 of the key 405. The intersecting ribs 422 may be in the form of vertical walls when viewed from a horizontal direction, and may be in the form of a web when viewed from a vertical direction.

Within the keycap 410, the coil spring 411 surrounds a first vertically extending protrusion 424. For example, the first protrusion 424 can be a post-shaped protrusion, a cylinder-shaped protrusion, a rod-shaped protrusion, or the like, that has either a circular cross-section or a ring-shaped cross-section. At one end, the first protrusion 424 is attached to, formed on, or otherwise provided on a downward facing surface of the top side of the keycap 410, and extends toward the bottom side of the top case 402.

In the example of FIG. 4, the magnet 412 is coupled to the first protrusion 424 at the other end of the first protrusion 424 and moves together with the first protrusion 424 and, hence, moves together with the keycap 410. For example, as illustrated in FIG. 4, the first protrusion 424 has a cavity at the other end which houses the magnet 412. The magnet 412 generates a magnetic field surrounding it.

In some implementations, the first protrusion 424 extends the entire length of the coil spring 411. In these implementations the coil spring 411 has a plurality of windings around the first protrusion 424—and the first protrusion 424 guides the coil spring 411 preventing the body of the coil spring 411 from bending or twisting about the spring axis in the event of a user pushing or depressing the key 405 from its top side. This reduces the likelihood of breakage of the coil spring 411 and the likelihood of failure of the key 405 and improves the operational life of the keyboard 400.

In some other implementations, the first protrusion 424 does not extend the entire length of the coil spring 411. For example, as illustrated in FIG. 4, the first protrusion 424 extends entirely within the body of the coil spring 411, but only partially in the length of the coil spring 411.

In those other implementations, as illustrated in FIG. 4, there can be a second protrusion 425 that is attached to, formed on, or otherwise provided on an upward facing surface of the bottom side of the top case 402, and extends toward the top side of the keycap 410. For example, like the first protrusion 424, the second protrusion 425 can be a post-shaped protrusion, a cylinder-shaped protrusion, a rod-shaped protrusion, or the like, that has either a circular cross-section or a ring-shaped cross-section.

In some implementations, the first protrusion 424 and the second protrusion 425 are identical in length while in other implementations, they differ in length, i.e., in amount of protrusion with reference to the respective surfaces on which they are positioned. For example, the first protrusion 424 can be shorter or is less protruding than the second protrusion 425, or vice versa.

In particular, however, the second protrusion 425 on the top case 402 is a matching or reciprocal protrusion that is dimensioned to mate with the first protrusion 424 on the keycap 410 to form the guidance for the coil spring 411. For example, as illustrated in FIG. 4, the second protrusion 425 can have a hollow cylinder shape with a ring-shaped cross-section with a ring size (interior diameter) that is at least the diameter of the cross-section of the first protrusion 424, such that when pressed against each other, the first protrusion 424 can at least partially recess or insert into the second protrusion 425.

Alternatively, as another example, the first protrusion 424 can have a hollow cylinder shape with a ring-shaped cross-section with a ring size (interior diameter) that is at least the diameter of the cross-section of the second protrusion 425, such that when pressed against each other, the second protrusion 425 can at least partially recess or insert into the first protrusion 424.

In those other implementations, the coil spring 411 has a plurality of windings around partially around the first protrusion 424 and partially around the second protrusion 425—and the protrusion 424 and the second protrusion 425 works together in conjunction to guide the coil spring 411 preventing the body of the coil spring 411 from bending or twisting about the spring axis in the event of a user pushing or depressing the key 405 from its top side.

Not only does this reduce the likelihood of breakage of the coil spring 411 and the likelihood of failure of the key 405, but the fact that the guidance for the coil spring 411 has two separate parts may also simplify the assembly process of the keyboard 400 and reduce manufacturing costs because it is easier to insert protrusions in shorter lengths into the body of the coil spring 411 from either end.

In yet other implementations, there can be more than one vertically extending protrusion that are positioned side by side within the keycap 410. For example, there can be two vertically extending protrusions that are positioned side by side within the key 405. The coil spring 411 surrounds one of the two vertically extending protrusions, and the magnet 412 is coupled to another one of the two vertically extending protrusions. The two vertically extending protrusions need not have the same shape. Nor need they extend the same length.

In FIG. 4, the keyboard 400 also includes a display 440 for presenting content through the top case 402 of the keyboard 400. The display 440 is positioned below the top case 402 and below the plurality of keys, including the key 405. The content, as described in this disclosure, is presented on a visual side 442 of the display 440, where the visual side 442 faces the top case 402 and the plurality of keys, such that at least some of the content is visible through the top case 402 and the keycap 410 of the keyboard 400.

The keyboard 400 also includes a printed circuit board 460. The printed circuit board 460 is positioned below the display 440 and thus, below the top case 402 and below the plurality of keys, including the key 405. The printed circuit board 460 includes a top surface that faces toward the display 440 and a bottom surface that faces away from the display 440.

The printed circuit board 460 is electrically coupled to a plurality of magnetic field sensors, e.g., the magnetic field sensor 462, that are positioned on the bottom surface of the printed circuit board 460. For example, the magnetic field sensor 462 can be a Hall-effect sensor, or an anisotropic magnetoresistance (AMR) sensor, or a giant magnetoresistance (GMR) sensor, to name just a few.

The plurality of magnetic field sensors generally correspond to the plurality of keys included in the keyboard 400. For example, the magnetic field sensor 462 can correspond to the key 405. In some implementations, all of the plurality of magnetic field sensors are the same type of sensor while in other implementations, the plurality of magnetic field sensors can include different types of sensors. In some implementations, each key has a distinct magnetic field sensor while in other implementations, two or more of the keys can share a magnetic field sensor, or each key can correspond to multiple magnetic field sensors.

The magnetic field sensor 462 is configured to measure a magnetic field strength associated with, e.g., generated by, the magnet 412, near the magnetic field sensor 462, and the magnetic field strength is indicative of a relative distance along a vertical direction between the magnet 412 and the magnetic field sensor 462. The greater the distance, or, put another way, the lower the physical proximity of the magnet 412 to the magnetic field sensor 462, the weaker the magnetic field strength that can be measured by the magnetic field sensor 462. On the other hand, the shorter the distance, or, put another way, the greater the physical proximity of the magnet 412 to the magnetic field sensor 462, the stronger the magnetic field strength that can be measured by the magnetic field sensor 462.

Changes in the magnetic field strength measured by the magnetic field sensor 462 are caused by vertical movement of the keycap 410. If a user presses down on the keycap 410, the keycap 410 travels downward. For example, when it is depressed by a user, the keycap 410 will come to a rest when the bottom of the keycap 410 contacts the upward facing surface of the bottom side of the top case 402. Because the magnet 412 is coupled to the first protrusion 424 of the keycap 410, and hence, moves together with the keycap 410, the magnet 412 also travels downward, i.e., toward the magnetic field sensor 462 that is positioned on the bottom surface of the printed circuit board 460. As the distance between the magnet 412 and the magnetic field sensor 462 reduces, the magnetic field strength measured by the magnetic field sensor 462 increases.

Because the coil spring 411 biases the keycap 410 upwardly toward an undepressed position, after the user releases the keycap 410, the keycap 410 travels upward. Correspondingly, the magnet 412 moves together with the keycap 410 to travels upward, i.e., away from the magnetic field sensor 462. As the distance between the magnet 412 and the magnetic field sensor 462 increases, the magnetic field strength measured by the magnetic field sensor 462 reduces.

In some implementations, when the keycap 410 is in an undepressed position, a distance between a bottom side of the magnet 412 and a top side the magnetic field sensor 462 is between 4 and 15 millimeters, e.g., between 4 and 10 millimeters, between 4 and 8 millimeters, between 8 and 15 millimeters, etc.

In some implementations, when the keycap 410 is in a depressed position, a distance between a bottom side of the magnet 412 and the top side the magnetic field sensor 462 is between 1 and 12 millimeters, e.g., between 1 and 7 millimeters, between 1 and 5 millimeters, between 5 and 12 millimeters, etc.

In some implementations, when the keycap 410 is in the undepressed position, a distance between the downward facing surface of the top side of the keycap 410 and the upward facing surface of the bottom side of the top case 402 is between 10 and 20 millimeters, e.g., about 13.50 millimeters, about 15 millimeters, or about 17.50 millimeters. In some implementations, the keycap 410 can have a possible travel range in the vertical direction of about 4.00 millimeters.

Differences in the magnetic field strength measured by the magnetic field sensor 462 can be used to evaluate a relative position of the keycap 410 with reference to the top case 402 and, hence, an operational state of the keycap 410 of the key 405. In implementations, a change in detected magnetic field strength value can indicate that a relative distance between the magnet 412 and the magnetic field sensor 462 has changed. This change in relative distance can indicate that the keycap 410 has moved vertically relative to the top case 402.

For example, the magnetic field sensor 462 measuring a relative change in magnetic field strength exceeding a predetermined delta value (e.g., in terms of milli-Tesla, Ampere per centimeter, or another appropriate magnetic unit) can indicate that the keycap 410 has moved from a rest or undepressed position to a depressed position, or from a depressed position to a rest or undepressed position.

As another example, the magnetic field sensor 462 measuring a magnetic field strength exceeding a predetermined higher threshold value (e.g., in terms of milli-Tesla, Ampere per centimeter, or another appropriate magnetic unit) can indicate that the keycap 410 has moved into a depressed position, e.g., from a rest or undepressed position.

As yet another example, the magnetic field sensor 462 measuring a magnetic field strength below a predetermined lower threshold value (e.g., in terms of milli-Tesla, Ampere per centimeter, or another appropriate magnetic unit) can indicate that the keycap 410 has moved into a rest or undepressed position, e.g., from a depressed position.

In any of these examples, by way of measuring the magnetic field strength surrounding it, the magnetic field sensor 462 can provide information about the operational state of the key 405. The operational state of the key 405 will match the operational position of the keycap 410. That is, when the keycap 410 has moved into a depressed position, the key 405 also enters an actuated or depressed state. Alternatively, when the keycap 410 has moved into a rest or undepressed position, the key 405 also enters an unactuated or undepressed state.

In implementations, the printed circuit board 460 can include a microcontroller, e.g., a field programmable gate array or another printed circuit, that is communicatively coupled to the magnetic field sensor 462, e.g., through the conductor traces provided on the printed circuit board 460. The magnetic field sensor 462 outputs the measured magnetic field strength values to the microcontroller—and the microcontroller processes the magnetic field strength values received from the magnetic field sensor 462 to determine the operational state of the key 405, namely whether the key 405 is in an actuated or depressed state, or is alternatively in an unactuated or undepressed state. The microcontroller can generate an electrical signal, e.g., an input to the user computing device when the key 405 is in an actuated or depressed state, i.e., when keycap 410 is depressed by the user. For example the electrical signal can be a signal to operate the user computing device, e.g., for typing or executing other operations of the user computing device.

Figure 5:
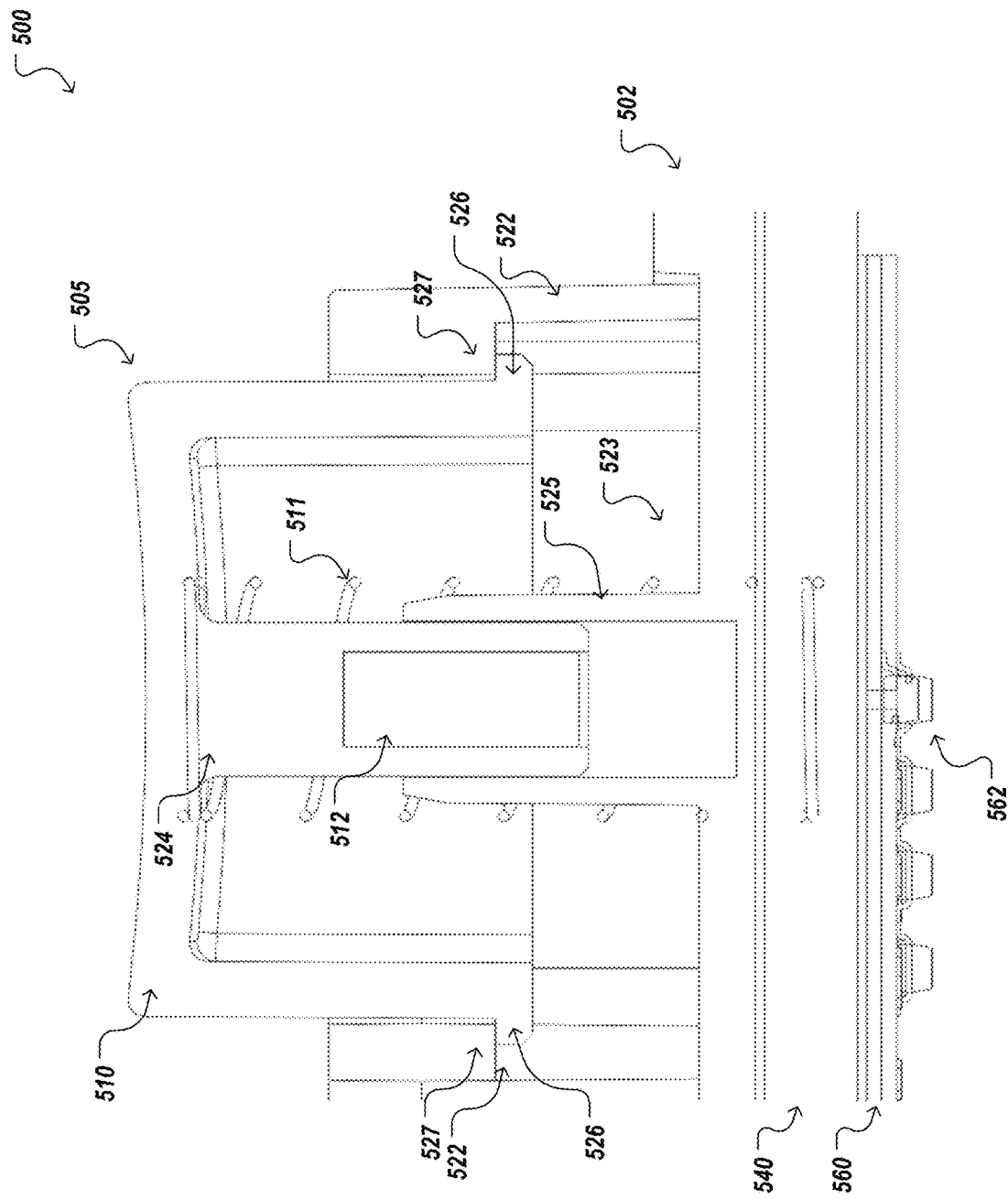
FIG. 5 is a cross-sectional view of an example of a keyboard.

FIG. 5 is a cross-sectional view of an example of a keyboard 500 along a vertical plane through the keyboard 500. The keyboard 500 includes a key 505 which includes a keycap 510, a coil spring 511, and a magnet 512, where the coil spring 511 biases the keycap 510 upwardly toward an undepressed position. The keyboard 500 includes a top case 502. The top case 502 has intersecting ribs 522 that form an aperture 523 which receives the keycap 510 of the key 505.

The keyboard 500 also includes a display 540 for presenting content through the top case 502 of the keyboard 500. The keyboard 500 further includes a printed circuit board 560 that is electrically coupled to a plurality of magnetic field sensors, e.g., the magnetic field sensor 562, that are positioned on the bottom surface of the printed circuit board 560.

The keycap 510 has a first protrusion 524 that is provided on a downward facing surface of the top side of the keycap 510, and that extends toward the bottom side of the top case 502. The top case 502 has a second protrusion 525 that is provided on an upward facing surface of the bottom side of the top case 502, and that extends toward the top side of the keycap 510. The coil spring 511 has a plurality of windings around partially around the first protrusion 524 and partially around the second protrusion 525.

The keycap 510 includes one or more flanges 526 that extend at least partially around the perimeter at the bottom or base of the keycap 510. In some implementations, the flange 526 can have a length of about 0.7 millimeters (measured from an outward facing surface of the vertical side wall of the keycap 510). As shown in FIG. 5, the flange 526 extends away from the center of key keycap 510 such that the flange 526 extends outside of the edge of the vertical side walls of the keycap 510. In some implementations, the flange 526 is not angled while in other implementations, the flange 526 can be angled.

The top case 502 includes one or more corresponding flanges 527 that extend at least partially around the perimeter at the top of the intersecting ribs 522. In some implementations, the flange 527 can have a length of about 7.0 millimeters (measured from an inward facing surface of the intersecting rib of the top case 502). As shown in FIG. 5, the flange 527 extends toward the coil spring 511 such that the flange 527 extends inside of the edge of the vertical side walls of the intersecting ribs 522 of the top case 502.

Like the flange 526, in some implementations, the flange 527 is not angled while in other implementations, the flange 527 can be angled. Generally, however, the flange 526 of the keycap 510 should have a geometric shape that matches or mates with that of the flange 527 of the top case 502.

The one or more flanges 526 of the keycap 510 and the one or more flanges 527 of the top case 502 together provides a snap fit locking mechanism that limits the vertical movement or height of the keycap 510, and in particular, prevents the keycap 510 from coming off of the top case 502 of the keyboard 500 during its operation.

When the keycap 510 is depressed by the user, i.e., when it is not in its rest or undepressed position, the one or more flanges 526 of the keycap 510 and the one or more flanges 527 of the top case 502 are not in contact with each other. However, when the keycap 510 is released by the user, i.e., when it is in its rest or undepressed position, the one or more flanges 526 of the keycap 510 is in contact with the one or more corresponding flanges 527 of the top case 502, and the one or more flanges 527 thus prevent the keycap 510 from moving further upward due to the spring force of the coil spring 511.

Figure 6B:
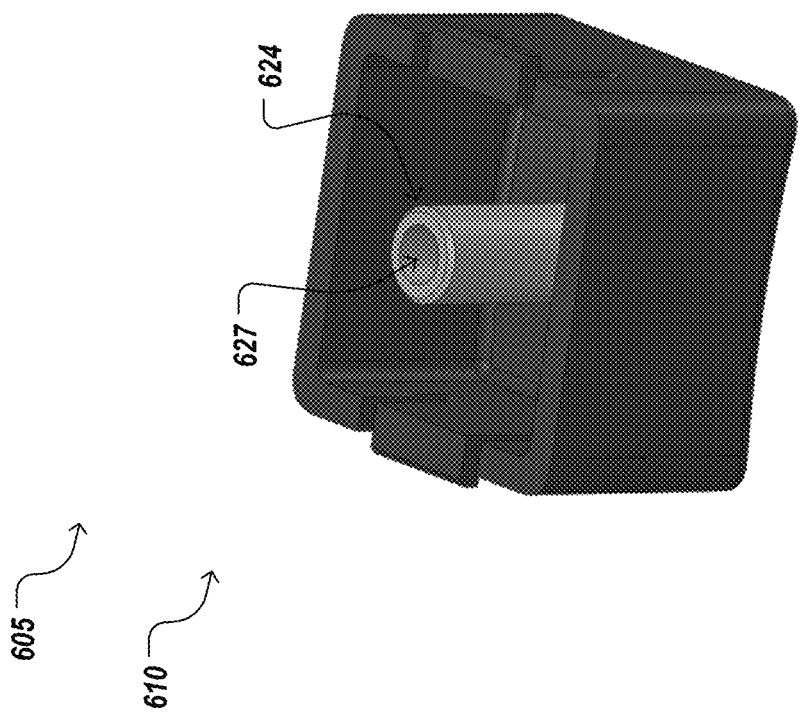
FIGS. 6A-B are perspective side top and bottom views, respectively, of a keycap.
Figure 6A:
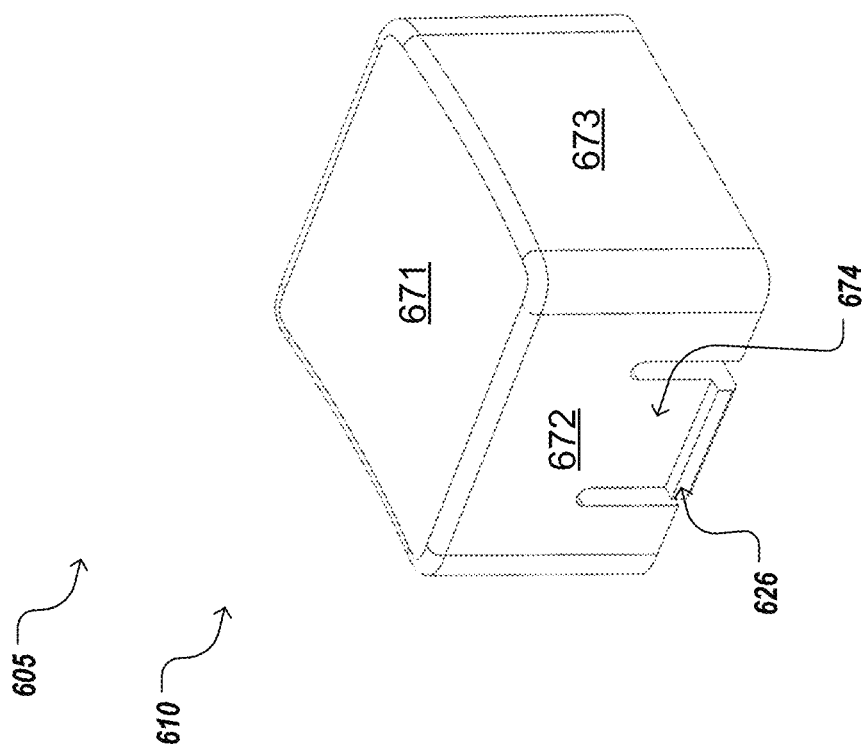

FIGS. 6A-B are perspective side top and bottom views, respectively, of a keycap 610 of a key 605 of an example of a keyboard. As illustrated in FIG. 6A, the keycap 610 has an upward facing surface 671 that the finger of the user engages with and pushes or depresses to actuate the key 605 and four vertical side walls, e.g., vertical side walls 672, 673.

As illustrated in FIG. 6B, the keycap 610 has a first protrusion 624 that is provided at or near a center of a downward facing surface of the top side of the keycap 610. The first protrusion 624 can either be integrally formed with, or can alternatively be coupled to the keycap 610. The first protrusion 624 can have a hollow cylinder shape with a ring-shaped cross-section, thus allowing it to be easily inserted into the body of a coil spring to provide guidance for the coil spring. The first protrusion 624 can have a cavity 627 at an end which can house a magnet.

In some implementations, as illustrated in FIGS. 6A-B, the keycap 610 includes two arms on two opposite vertical side walls of the keycap 610, e.g., an arm 674 on the vertical side wall 672. The arm 674 has a flange 626 that extends the width of the arm 674 at its bottom. In other implementations, the keycap 610 can include fewer arms, e.g., one arm, or more arms, e.g., three arms or four arms on respective vertical side walls of the keycap 610, where each arm has a flange that extends the width of the arm at its bottom.

As part of the assembly process of the keyboard, when inserting the keycap 610 into an aperture formed by intersecting ribs of a top case of the keyboard, the arm 674 bends inward toward the center of the keycap 610 in response to application of a sufficient force, and therefore allows the flange 626 to retract from extending outside of the edge of the vertical side wall 672 of the keycap 610 to facilitate the insertion of the keycap 610 into the top case, which has one or more corresponding flanges, and to provide a snap fit locking mechanism between the keycap 610 and the top case.

A number of implementations have been described. While this specification contains many specific implementation details, these should not be construed as limitations on the scope of what is being claimed, which is defined by the claims themselves, but rather as descriptions of features that may be specific to particular implementations of particular inventions. It will be understood that various modifications may be made.

The subject matter and the actions and operations described in this specification can be implemented in digital electronic circuitry, in tangibly-embodied computer software or firmware, in computer hardware, including the structures disclosed in this specification and their structural equivalents, or in combinations of one or more of them. The subject matter and the actions and operations described in this specification can be implemented as or in one or more computer programs, e.g., one or more modules of computer program instructions, encoded on a computer program carrier, for execution by, or to control the operation of, data processing apparatus. The carrier can be a tangible non-transitory computer storage medium. Alternatively or in addition, the carrier can be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

The term "data processing apparatus" encompasses all kinds of apparatus, devices, and machines for processing data, including by way of example a programmable processor, a computer, or multiple processors or computers. Data processing apparatus can include special-purpose logic circuitry, e.g., an FPGA (field programmable gate array), an ASIC (application-specific integrated circuit), or a GPU (graphics processing unit). The apparatus can also include, in addition to hardware, code that creates an execution environment for computer programs, e.g., code that constitutes processor firmware, a protocol stack, a database management system, an operating system, or a combination of one or more of them.

A computer program can be written in any form of programming language, including compiled or interpreted languages, or declarative or procedural languages; and it can be deployed in any form, including as a stand-alone program, e.g., as an app, or as a module, component, engine, subroutine, or other unit suitable for executing in a computing environment, which environment may include one or more computers interconnected by a data communication network in one or more locations.

A computer program may, but need not, correspond to a file in a file system. A computer program can be stored in a portion of a file that holds other programs or data, e.g., one or more scripts stored in a markup language document, in a single file dedicated to the program in question, or in multiple coordinated files, e.g., files that store one or more modules, sub-programs, or portions of code.

The processes and logic flows described in this specification can be performed by one or more computers executing one or more computer programs to perform operations by operating on input data and generating output. The processes and logic flows can also be performed by special-purpose logic circuitry, e.g., an FPGA, an ASIC, or a GPU, or by a combination of special-purpose logic circuitry and one or more programmed computers.

Computers suitable for the execution of a computer program can be based on general or special-purpose microprocessors or both, or any other kind of central processing unit. Generally, a central processing unit will receive instructions and data from a read-only memory or a random access memory or both. The essential elements of a computer are a central processing unit for executing instructions and one or more memory devices for storing instructions and data. The central processing unit and the memory can be supplemented by, or incorporated in, special-purpose logic circuitry.

Generally, a computer will also include, or be operatively coupled to, one or more mass storage devices, and be configured to receive data from or transfer data to the mass storage devices. The mass storage devices can be, for example, magnetic, magneto-optical, or optical disks, or solid state drives. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

To provide for interaction with a user, the subject matter described in this specification can be implemented on one or more computers having, or configured to communicate with, a display device, e.g., a LCD (liquid crystal display) monitor, or a virtual-reality (VR) or augmented-reality (AR) display, for displaying information to the user, and an input device by which the user can provide input to the computer, e.g., a keyboard and a pointing device, e.g., a mouse, a trackball, a touchpad, and examples of the computer mouse 50 described in this disclosure. Other kinds of devices can be used to provide for interaction with a user as well; for example, feedback and responses provided to the user can be any form of sensory feedback, e.g., visual, auditory, speech or tactile; and input from the user can be received in any form, including acoustic, speech, or tactile input, including touch motion or gestures, or kinetic motion or gestures or orientation motion or gestures. In addition, a computer can interact with a user by sending documents to and receiving documents from a device that is used by the user; for example, by sending web pages to a web browser on a user's device in response to requests received from the web browser, or by interacting with an app running on a user device, e.g., a smartphone or electronic tablet. Also, a computer can interact with a user by sending text messages or other forms of message to a personal device, e.g., a smartphone that is running a messaging application, and receiving responsive messages from the user in return.

Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

Accordingly, other implementations are within the scope of the claims.

What is claimed is:

1. A keyboard comprising:
   a keycap, the keycap comprising multiple vertical keycap side walls, wherein at least one vertical keycap side wall comprises a bendable arm that has a keycap flange on an outward facing surface of the at least one vertical keycap side wall;
   a display comprising a visual side that presents content;
   a transparent top case overlaying the visual side of the display, wherein the transparent top case comprises a top case flange that engages with the keycap flange to allow the keycap to move vertically but to prevent the keycap from coming off;
   a coil spring extending from a top side of the keycap to a bottom side of the transparent top case, wherein the coil spring biases the keycap toward an undepressed position;
   a magnet positioned within the keycap; and
   a magnetic field sensor mounted on a bottom side of the display to measure a strength of a magnetic field generated by the magnet.

2. The keyboard of claim 1, further comprising a printed circuit board that is disposed on the bottom side of the display and that is electrically coupled to the magnetic field sensor.

3. The keyboard of claim 2, wherein a thickness of the printed circuit board is between 0.2 and 2 millimeters.

4. The keyboard of claim 1, wherein the magnetic field sensor comprises a Hall effect sensor, an anisotropic magneto-resistive (AMR) sensor, or a giant magnetoresistance (GMR) sensor.

5. The keyboard of claim 1, further comprising an optical adhesive layer positioned between the bottom side of the transparent top case and the visual side of the display.

6. The keyboard of claim 5, wherein a thickness of the optical adhesive layer is between 0.1 and 2 millimeters.

7. The keyboard of claim 1, wherein a distance between a bottom side of the magnet and the magnetic field sensor is between 4 and 15 millimeters.

8. The keyboard of claim 1, wherein a thickness of the display is between 1 and 20 millimeters.

9. The keyboard of claim 1, wherein a longitudinal dimension of the magnet is less than 10 millimeters.

10. The keyboard of claim 1, wherein a distance between the top side of the keycap when the keycap is in the undepressed position and the bottom side of the transparent top case is between 10 and 20 millimeters.

11. The keyboard of claim 1, wherein the keycap comprises a hollow cylinder coupled to the top side of the keycap, and wherein the hollow cylinder houses the magnet and is surrounded by at least a portion of the coil spring.

12. The keyboard of claim 11, wherein the coil spring has a plurality of windings around the hollow cylinder.

13. The keyboard of claim 11, wherein the coil spring has a greater length than the hollow cylinder.

14. The keyboard of claim 11, wherein the transparent top case comprises multiple vertical top case side walls arranged on a base component, and wherein at least one vertical top case side wall comprises the top case flange on an inward facing surface of the at least one vertical top case side wall.

15. The keyboard of claim 1, wherein the keycap is formed of transparent material.

16. The keyboard of claim 1, wherein the transparent top case has transmittance of at least 50%.

17. The keyboard of claim 1, wherein the display is configured to present the content on the visual side of the display such that at least some of the content is visible through the transparent top case and through the keycap.

18. The keyboard of claim 1, wherein the keycap comprises a plurality of coil springs.

19. A keyboard comprising:
    a keycap, the keycap comprising multiple vertical keycap side walls, wherein at least one vertical keycap side wall comprises a bendable arm that has a keycap flange on an outward facing surface of the at least one vertical keycap side wall;
    a top case, wherein the top case comprises a top case flange that engages with the keycap flange to allow the keycap to move vertically but to prevent the keycap from coming off;
    a coil spring extending from a top side of the keycap to a bottom side of the top case, wherein the coil spring biases the keycap toward an undepressed position;
    a magnet positioned within the keycap; and
    a magnetic field sensor mounted on a bottom side of the top case to measure a strength of a magnetic field generated by the magnet.

20. The keyboard of claim 19, wherein the top case comprises multiple vertical top case side walls arranged on a base component, and wherein at least one vertical top case side wall comprises the top case flange on an inward facing surface of the at least one vertical top case side wall.

* * * * *